United States Patent (10) Patent No.: US 7,193,468 B2
Kwon et al. (45) Date of Patent: Mar. 20, 2007

(54) ACTIVE LOAD CIRCUIT FOR LOW-VOLTAGE CMOS VOLTAGE GAIN AMPLIFIER WITH WIDE BANDWIDTH AND HIGH GAIN CHARACTERISTIC

(75) Inventors: Jong Kee Kwon, Daejeon (KR); Gyu Hyeong Cho, Daejeon (KR); Mun Yang Park, Daejeon (KR); Jong Dae Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/846,082

(22) Filed: May 14, 2004

(65) Prior Publication Data

US 2005/0253654 A1 Nov. 17, 2005

(51) Int. Cl.
*H03F 3/45* (2006.01)
(52) U.S. Cl. ....................................... 330/260
(58) Field of Classification Search ................. 330/260
See application file for complete search history.

(56) References Cited

U.S. PATENT DOCUMENTS 5,757,230 A 5/1998 Mangelsdorf
6,114,907 A * 9/2000 Sakurai ....................... 330/253

FOREIGN PATENT DOCUMENTS

JP 2002-157031 5/2002
KR 000061733 10/2000

OTHER PUBLICATIONS

Electronics Letters, May 15, 2003, vol. 39, No. 10, pp. 759-760.
A 270 MHz, 1 V pk-pk, Low-Distortion Variable Gain Amplifier in 0.35 um CMOS process, pp. 307-310.
Electronics Letters, Jun. 22, 2000, vol. 36, No. 13, pp. 1096-1098.

* cited by examiner

*Primary Examiner*—Steven J. Mottola
(74) *Attorney, Agent, or Firm*—Blakely Sokoloff Taylor & Zafman

(57) ABSTRACT

Provided is an active load circuit of a voltage gain amplifier, which allows a high voltage gain with a low supply voltage operation in high-frequency range. The active load circuit includes a PMOS transistor which is connected between the amplifying unit and a power supply voltage and functions as a load element in a low frequency range; a negative feedback buffering unit which is connected to the gate of the PMOS transistor and functions as a common drain amplifier to stabilize the output voltage of the voltage gain amplifier and drive the voltage gain amplifier at a low voltage; and a capacitor which is connected to the negative feedback buffering unit and compensates for both an impedance and a frequency characteristics when the voltage gain amplifier operates in a high frequency range.

6 Claims, 3 Drawing Sheets

ACTIVE LOAD CIRCUIT FOR LOW-VOLTAGE CMOS VOLTAGE GAIN AMPLIFIER WITH WIDE BANDWIDTH AND HIGH GAIN CHARACTERISTIC

BACKGROUND OF THE INVENTION

1. Field of the Invention

The present invention relates to an active load circuit for a voltage gain amplifier, and more particularly, for a high-frequency low-voltage complementary-metal-oxide-semiconductor (CMOS) voltage gain amplifier with a wide bandwidth and a high gain characteristic.

2. Description of the Related Art

When a circuit for a CMOS voltage gain amplifier is designed, various factors, such as a voltage gain, operating frequency bandwidth, low distortion, an input signal range for obtaining a desired linearity, a noise characteristic, and a signal to noise ratio (SNR) should be considered.

To achieve a high gain, a voltage gain amplifier even in low voltage operation must have its high output impedance with an output load element. A resistor is generally used as the output load element. FIG. 1 is a circuit diagram of a conventional voltage gain amplifier using resistors as its output load elements.

Referring to FIG. 1, a voltage gain amplifier (10) comprises a first MOS transistor (15) and a second MOS transistor (20), which are connected to each other in a differential pair configuration.

A first input voltage +Vid is input signal to the gate of the first MOS transistor 15, and a second input voltage −Vid, which is a differential signal of the first input voltage +Vid, is input signal to the gate of the second MOS transistor 20. The source of the first MOS transistor 15 is connected to the source of the second MOS transistor 20, and a current source for supplying a predetermined bias is connected to the sources of the first and second MOS transistors 15 and 20. The drain of the first MOS transistor 15 and the drain of the second MOS transistor 20 are connected to load elements connected to a power supply voltage $V_{DD}$, for example, resistors 25a and 25b, respectively.

A common mode voltage signal Vic is a voltage source that provides DC voltage levels of the first and second input voltages +Vid and −Vid.

In this differential voltage gain amplifier 10, if signals of the first and second input voltages +Vid and −Vid are inputted to the first and second MOS transistors 15 and 20, respectively, the first and second MOS transistors 15 and 20 amplify a difference between the first and second input voltages +Vid and −Vid and output the amplified signal via output terminals Vo.

However, the values of the output resistors 25a and 25b are limited so that a desired voltage gain cannot be achieved even in a low voltage operation. Also, the voltage gain amplifier 10 exhibits its bandwidth characteristic in that a voltage gain remains constant in a certain frequency range, but it is dramatically reduced in a frequency range higher than the certain frequency range. Thus, the voltage gain amplifier cannot obtain a sufficiently wide bandwidth.

Further, the voltage gain amplifier mentioned is greatly dependent on the temperature variations or power supply voltage variations. In particular, a CMOS voltage gain amplifier considering the threshold voltage Vth of a MOS transistor, it is difficult to have a desired input/output signal range due to comparatively high its value of the resistors 25a and 25b in a low-voltage operation. For these reasons, the conventional voltage gain amplifier scheme with the resistor loads cannot achieve both a low-power characteristic and low-voltage/high-frequency operation.

SUMMARY OF THE INVENTION

According to the present invention, there is provided a new active load circuit for a differential voltage gain amplifier. The active load circuit comprises a first load device which is connected to the differential input pair of amplifier and a power supply voltage and functions as a load element in a low frequency range; and a second load device which is connected to the first load device and actively boosts a voltage gain in a high frequency range.

The first load device can be a PMOS transistor. The source of the PMOS transistor can be connected to the power supply voltage and the drain thereof can be connected to the differential input pair of amplifier.

The second load device can comprise a buffer with negative feedback connected to the gate of the PMOS transistor; and a compensation unit which is connected to the buffer and compensates for both its gain and its frequency characteristics in the high frequency range.

The buffer with negative feedback connection can comprise an NMOS transistor as a source follower, and a current source connected to the source of the NMOS transistor. Here, the gate of the NMOS transistor is connected to the drain of the PMOS transistor, the source thereof is connected to the gate of the PMOS transistor, and the drain thereof is connected to the power supply voltage. The compensation unit can be a capacitor, which is connected to the source of the NMOS transistor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
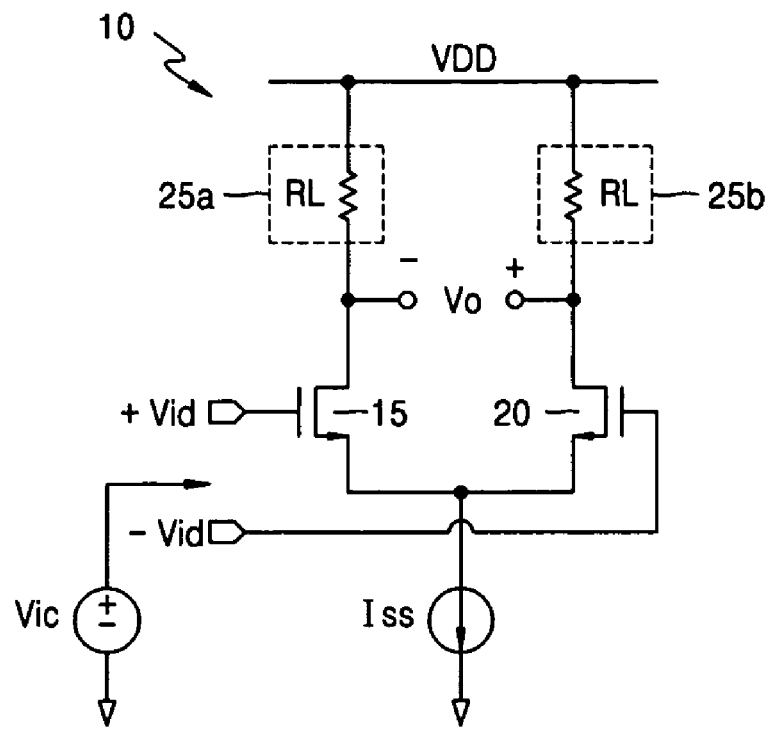
FIG. 1 is a circuit diagram of a conventional differential voltage gain amplifier.

The present invention will now be described more fully with reference to the accompanying drawings, in which exemplary embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 2:
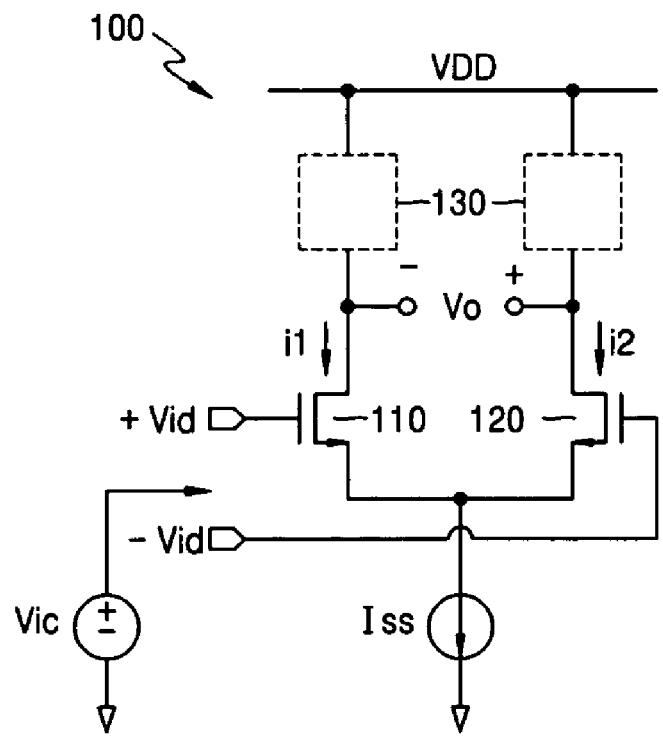
FIG. 2 is a circuit diagram of a differential voltage gain amplifier with an active load circuit according to the present invention.

Referring to FIG. 2, a voltage gain amplifier 100 of the present invention includes a first MOS transistor 110 and a second MOS transistor 120, which are connected to each other in a differential pair configuration.

A first input voltage +Vid is input to the gate of the first MOS transistor 110, and a second input voltage −Vid, which is a differential signal of the first input voltage +Vid, is input to the gate of the second MOS transistor 120. The source of the first MOS transistor 110 is connected to the source of the second MOS transistor 120. A current source Iss for supplying a predetermined bias is connected to the sources of the first and second MOS transistors 110 and 120. An active load circuit 130 is connected to a power supply voltage $V_{DD}$ and also to the drains (i.e., the output terminals) of the first and second MOS transistors 110 and 120.

Figure 3:
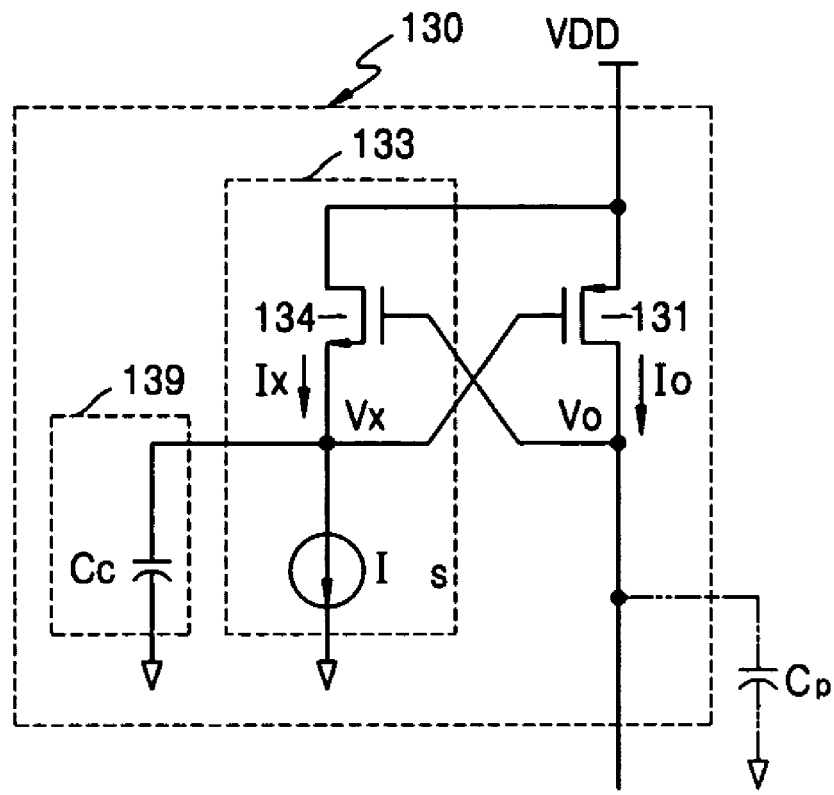
FIG. 3 is a circuit diagram of an active load circuit shown in FIG. 2.

FIG. 3 is a circuit diagram of the active load circuit 130 shown in FIG. 2.

The active load circuit 130 comprises a PMOS transistor 131, a buffering unit 133 as source follower, and a compensation unit 139. The PMOS transistor 131 operates as an active load in a low frequency range. The buffering unit 133 is connected to the gate of the PMOS transistor 131 and applies a stable driving voltage to the gate of the PMOS transistor 131. The compensation unit 139 is connected to the buffering unit 133 and compensates for both a gain and a frequency characteristic in a high frequency range.

The source of the PMOS transistor 131 is connected to the power supply voltage $V_{DD}$, and a drain thereof is connected to the drain of one of the first MOS transistor 110 or the second MOS transistor 120.

As described above, the buffering unit 133 is connected to the PMOS transistor 131 and stabilizes the output voltage of the voltage gain amplifier 100 and allows the voltage gain amplifier 100 to operate even at a low supply voltage. The buffering unit 133 includes an NMOS transistor 134 and a current source Is. The gate of the NMOS transistor 134 is connected to the drain of the PMOS transistor 131, and a source thereof is connected to the gate of the PMOS transistor 131. Also, the source of the NMOS transistor 134 is connected to the current source Is.

Figure 4:
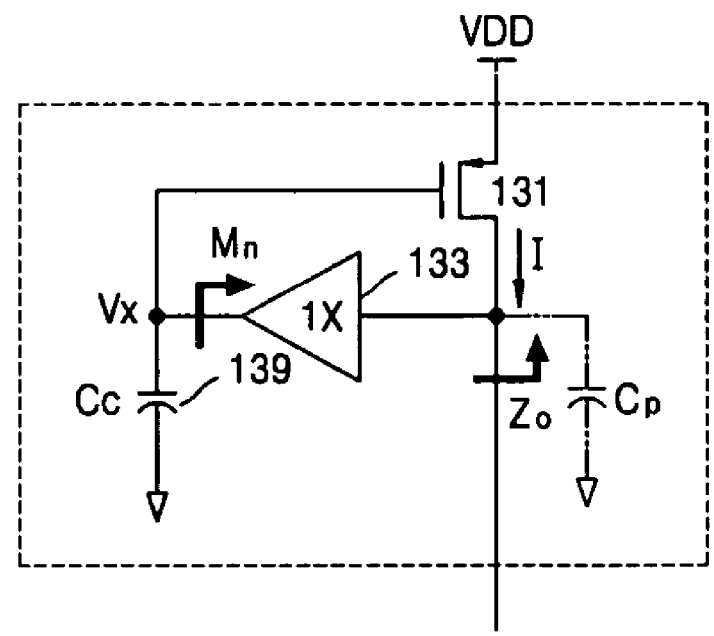
FIG. 4 is an equivalent circuit diagram of the active load circuit shown in FIG. 3.

The buffering unit 133, which includes the NMOS transistor 134 and the current source Is, functions as a common drain amplifier and is connected to the PMOS transistor 131 in a negative feedback configuration, as shown in FIG. 4 that is an equivalent circuit diagram of the active load circuit 130 shown in FIG. 3. The buffering unit 133 supplies a low drain/source voltage $V_{DS}$ to the PMOS transistor 131 such that the variable gain amplifier 100 outputs the output voltage at a stable DC level and is driven even at a low supply voltage.

The compensation unit 139 includes a capacitor $C_C$ that is connected to the source of the NMOS transistor 134. The compensation unit 139 boosts the gain of the voltage gain amplifier 100 in a high frequency range. That is, the operating frequency can increase to a high frequency range by controlling the capacitance of the capacitor $C_C$.

The operation of the active load circuit 130 will now be described.

The PMOS transistor 131 of the active load circuit 130 operates in a saturation mode in a low frequency range, and the impedance $Z_o$ of the active load circuit 130 becomes $1/gm_{131}$, which is a reciprocal of the transconductance of the PMOS transistor 131.

The impedance $Z_o$ of the active load circuit 130 in a high frequency range can be expressed using the gain boosting frequency ($\omega_z = gm_{134}/C_C$) as shown in Equation 1.

$$Z_o \approx [C_C/(gm_{131} \cdot gm_{134})] \cdot [S+(gm_{134}/C_C)] \qquad (1)$$

Here, gm is the transconductance of each transistor, and S is $j\omega$. The impedance $Z_0$ in Equation 1 is expressed as an inductance $j\omega L$. Thus, the impedance $Z_0$ can be considered as an inductance. The inductance, along with a parasitic capacitance (refer to Cp of FIG. 4) that may be generated at an output terminal of the voltage gain amplifier 100, results in a virtual parallel resonance circuit, which is comprised of a virtual parasitic capacitor, a virtual inductor, and a virtual resistor.

Accordingly, gain boosting and 3-dB frequency can be expanded by controlling the capacitance of the capacitor $C_C$ of the compensation unit 139. Hence, the voltage gain amplifier 100 can perform high-gain amplification over a wide bandwidth.

Figure 5:
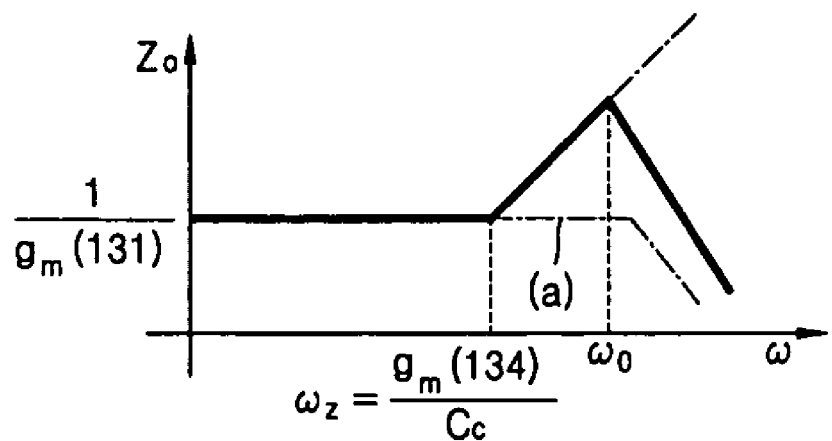
FIG. 5 is a simulated graph showing voltage gain (impedance) versus frequency in the voltage gain amplifier according to the present invention.

FIG. 5 is a simulated graph showing voltage gain (output impedance) versus frequency in the active load circuit 130 of the variable gain amplifier 100 according to the present invention.

Referring to FIG. 5, as described above, in a low frequency range of the gain frequency $\omega_z$ or less, since the PMOS transistor 131 operates in the saturation mode, the impedance $Z_0$ stays at $1/gm_{131}$.

Thereafter, as the frequency $\omega$ increases to a high frequency range, the impedance $Z_0$ is increased due to the inductance element as expressed in Equation (1).

Thereafter, as the frequency $\omega$ becomes higher than a resonance frequency $\omega_0$ of the virtual parallel resonance circuit that is comprised of the virtual inductor and parasitic capacitor, the impedance $Z_0$ gradually decreases due to the parasitic capacitance $C_p$.

Thus, in the voltage gain amplifier 100 of the present invention, a voltage gain becomes higher in the high frequency range due to the impedance $Z_0$ and a voltage gain remains high over a wider bandwidth as compared with a conventional impedance curve (a).

Figure 6:
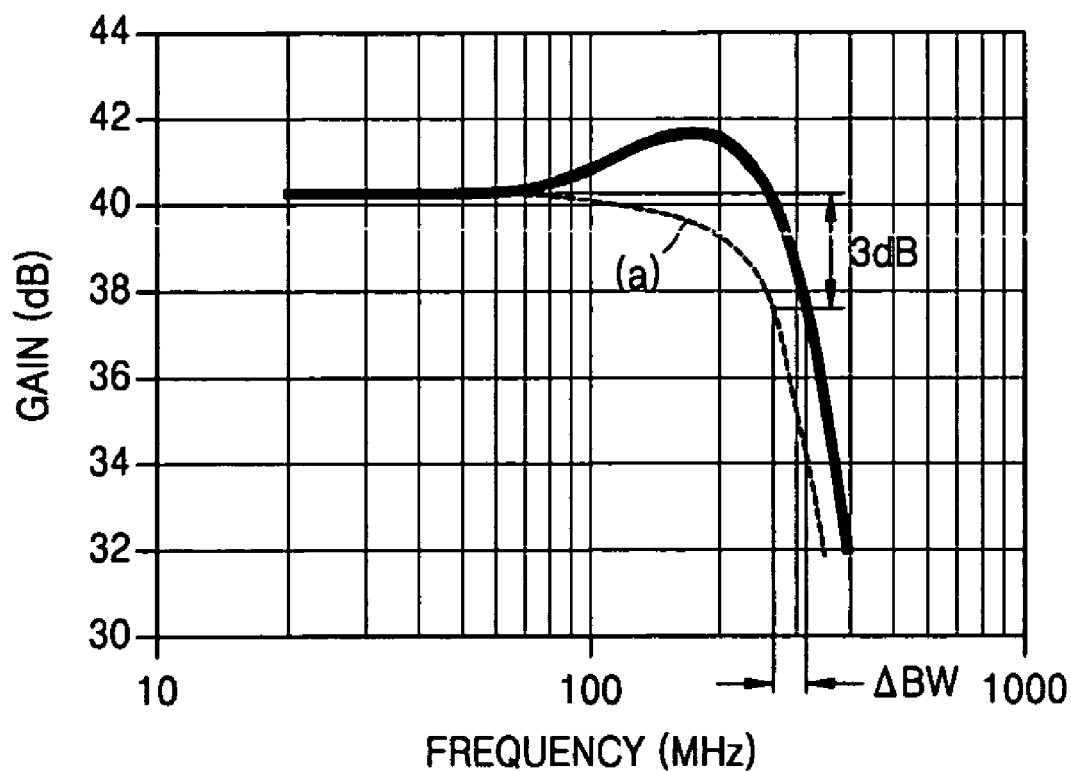
FIG. 6 is a logarithmic graph showing measurements of voltage gain (impedance) versus frequency in the voltage gain amplifier according to the present invention.

FIG. 6 is a logarithmic graph showing measurements of voltage gain (output impedance) versus frequency in the active load circuit 130 of the CMOS voltage gain amplifier 100 according to the present invention.

Referring to FIG. 6, in the variable gain amplifier 100 of the present invention, the frequency bandwidth has increased by ΔBW and the voltage gain has become higher compared with a conventional curve (a).

The active load circuit 130 provides a high gain in a low-voltage high-frequency range, and allows a high-voltage gain characteristic over a wide bandwidth by controlling the boosting frequency using the capacitor $C_C$ of the compensation unit 139. Also, since the active load circuit 130 comprises MOS transistors, it can be integrated with a voltage amplifying circuit comprised of MOS transistors.

As described above, the active load circuit, which functions as a load element of the voltage gain amplifier, comprises a PMOS transistor, a negative feedback buffering unit connected to an input terminal of the PMOS transistor, and a compensation unit that is connected to the negative feedback buffering unit and comprised of a capacitor $C_C$.

In the active load circuit, while only the PMOS transistor functions as a load element in a low frequency range, the buffering unit and the compensation unit operate as an impedance unit in a high frequency range, such that overall impedance of the voltage gain amplifier is increased.

Thus, the active load circuit can retain a high voltage gain over the entire frequency range. Also, a high voltage gain can be obtained in a wide bandwidth by controlling boosting frequency of the capacitor $C_C$ of the compensation unit.

Further, since the active load circuit comprises MOS transistors, a desired output load can be achieved using a simple structure, and the area occupied by impedance of the active load circuit can be reduced. Also, the active load circuit can be easily integrated with an amplifying circuit comprised of MOS transistors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An active load circuit for a voltage gain amplifier comprising an amplifying unit and load devices, the load circuit comprising:
   a first load device which is connected to the amplifying unit and a power supply voltage and functions as a load element in a low frequency range; and
   a second load device which is connected to the first load device and actively boosts a voltage gain in a high frequency range,
   wherein the second load device includes a negative feedback load buffering unit connected to a gate of the first load device, the negative feedback load buffering unit comprising an NMOS transistor and a current source connected to a source of the NMOS transistor.

2. The active load circuit of claim 1, wherein the first load device is a PMOS transistor, wherein the source of the PMOS transistor is connected to the power supply voltage and the drain of the PMOS transistor is connected to the amplifying unit.

3. The active load circuit of claim 2, wherein the second load device further comprises:
   a compensation unit which is connected to the negative feedback buffering unit and compensates for both a gain and a frequency characteristics in the high frequency range.

4. The active load circuit of claim 2,
   wherein the gate of the NMOS transistor of the negative feedback load buffering unit is connected to the drain of the PMOS transistor, the source of the NMOS transistor of the negative feedback load buffering unit is connected to the gate of the PMOS transistor, and the drain of the NMOS transistor is connected to the power supply voltage.

5. The active load circuit of claim 1, wherein the compensation unit is a capacitor, which is connected to the source of the NMOS transistor.

6. An active load circuit for a variable gain amplifier comprising an amplifying unit and load devices, the load circuit comprising:
   a PMOS transistor which is connected between the amplifying unit and a power supply voltage and functions as a load element in a low frequency range;
   a negative feedback buffering unit which is connected to the gate of the PMOS transistor and functions as a common drain amplifier to stabilize output voltage of a voltage gain amplifier and drive the PMOS transistor at a low voltage; and
   a capacitor which is connected to the negative feedback buffering unit and compensates for an impedance when the variable gain amplifier operates in a high frequency range.

* * * * *